Nov. 1, 1932. G. R. FREMONT Re. 18,640

RADIO TUNING MECHANISM

Original Filed Aug. 18, 1925 3 Sheets-Sheet 1

Inventor
George R. Fremont
By
Mason Fenwick & Lawrence
Attorney

Nov. 1, 1932. G. R. FREMONT Re. 18,640

RADIO TUNING MECHANISM

Original Filed Aug. 18, 1925 3 Sheets-Sheet 2

Inventor

GEORGE R. FREMONT

By Mason Fenwick & Lawrence

Attorneys

Nov. 1, 1932. G. R. FREMONT Re. 18,640
RADIO TUNING MECHANISM
Original Filed Aug. 18, 1925 3 Sheets-Sheet 3
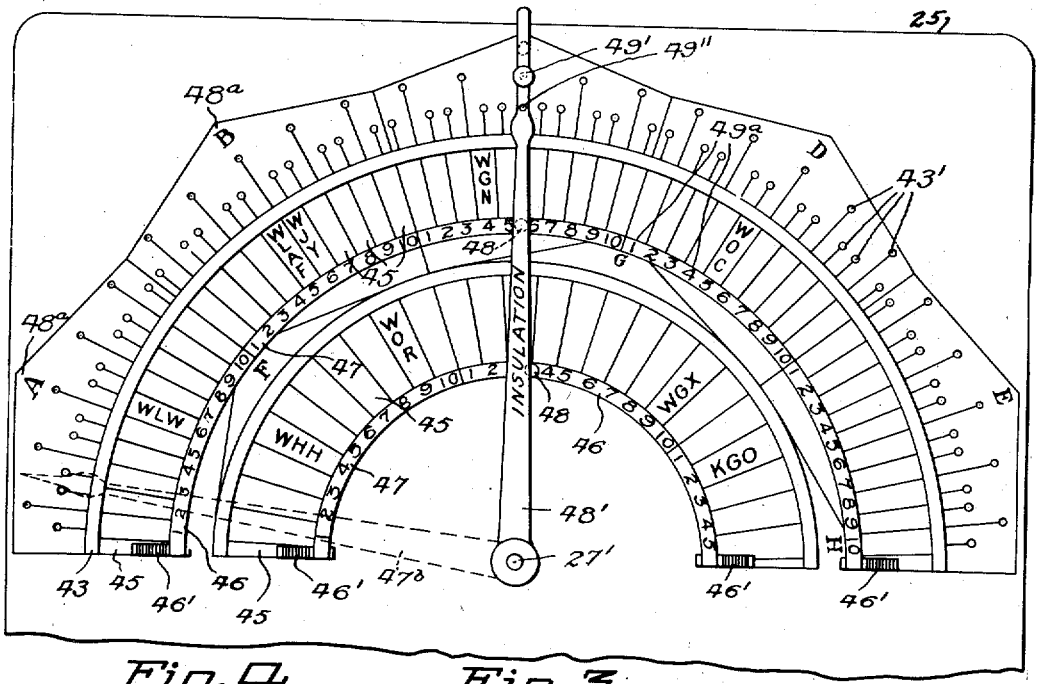
Fig. 4.
Fig. 3.
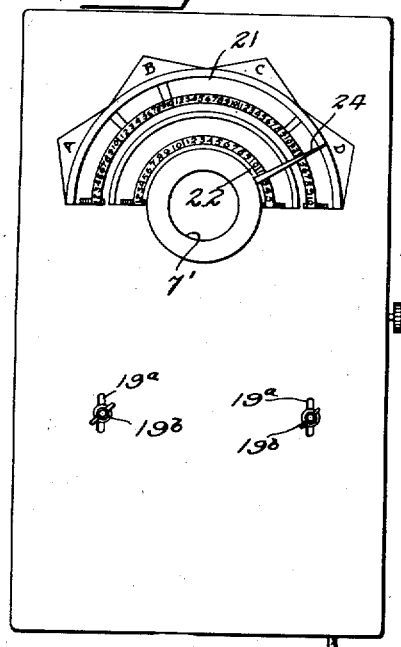
Fig. 5.
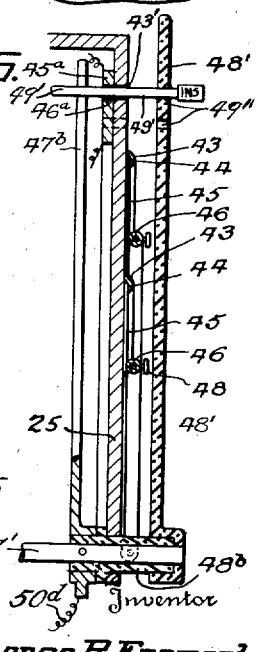
Fig. 6.
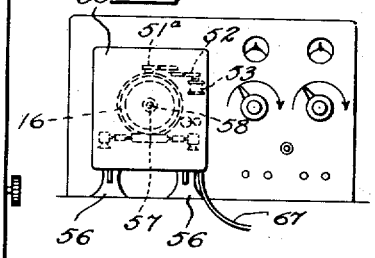
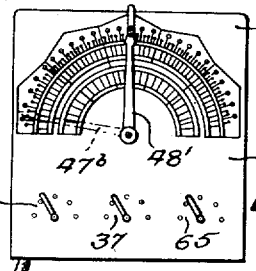
Inventor
George R. Fremont
By Mason Fenwick & Lawrence
Attorney Reissued Nov. 1, 1932

Re. 18,640

UNITED STATES PATENT OFFICE

GEORGE R. FREMONT, OF CHARLESTON, SOUTH CAROLINA

RADIO TUNING MECHANISM

Original No. 1,681,529, dated August 21, 1928, Serial No. 51,275, filed August 18, 1925. Application for reissue filed March 4, 1932. Serial No. 596,845.

My invention is a radio tuning mechanism, and its principal object is to provide a radio tuning mechanism wherein the various adjustable tuning elements of a radio outfit may be simultaneously adjusted through the instrumentality of a common control arranged at a point remote from the radio cabinet.

A further object of the invention is to provide a radio tuning mechanism adapted to be manually set for tuning in a predetermined station, whereby to operate an electrically controlled mechanism which will adjust or tune in the condensers in synchronism, and after the completion of such adjustment will be automatically rendered inoperative.

Another object of the invention is to provide a remote control mechanism for radio receiving sets which will permit a maximum number of radio stations to be logged, thus permitting exceedingly close or fine tuning.

It is another object of my invention to provide a radio call letter or tuning chart, wherein the call letters representing the stations are arranged in groups, each group having a key thus enabling the operator to quickly tune in.

Still another object of the invention is to provide a radio tuner which will permit the operator to be seated among the audience, and thereby be relieved of the noise and other annoyance and discomfort incident to operating the present radio control dial.

Further, the invention contemplates means for controlling or tuning a radio set embodying a portable control unit containing a scale or log of the various radio stations, together with electrical means associated with the condensers or tuning elements which are operated by the portable control unit.

Briefly stated, the invention consists of two motor circuits, one of which is located in the radio cabinet and geared to the axially adjustable condensers or tuning elements, and the other being located in a portable container adapted to repose upon the lap of the operator at a point remote from the radio cabinet, and switch means for simultaneously operating the motors to tune the condensers or tuning elements to a predetermined wave length or station.

On the drawings:

Figure 3 is an enlarged plan view of the control unit embodied in the invention;

Figure 4 is a view partly in elevation and partly in perspective of the radio receiving set and the remote control unit;

Figure 5 is a detail view partly in section and partly in elevation of the remote control unit; and Figure 6 is a modified embodiment of the invention.

Figure 1:
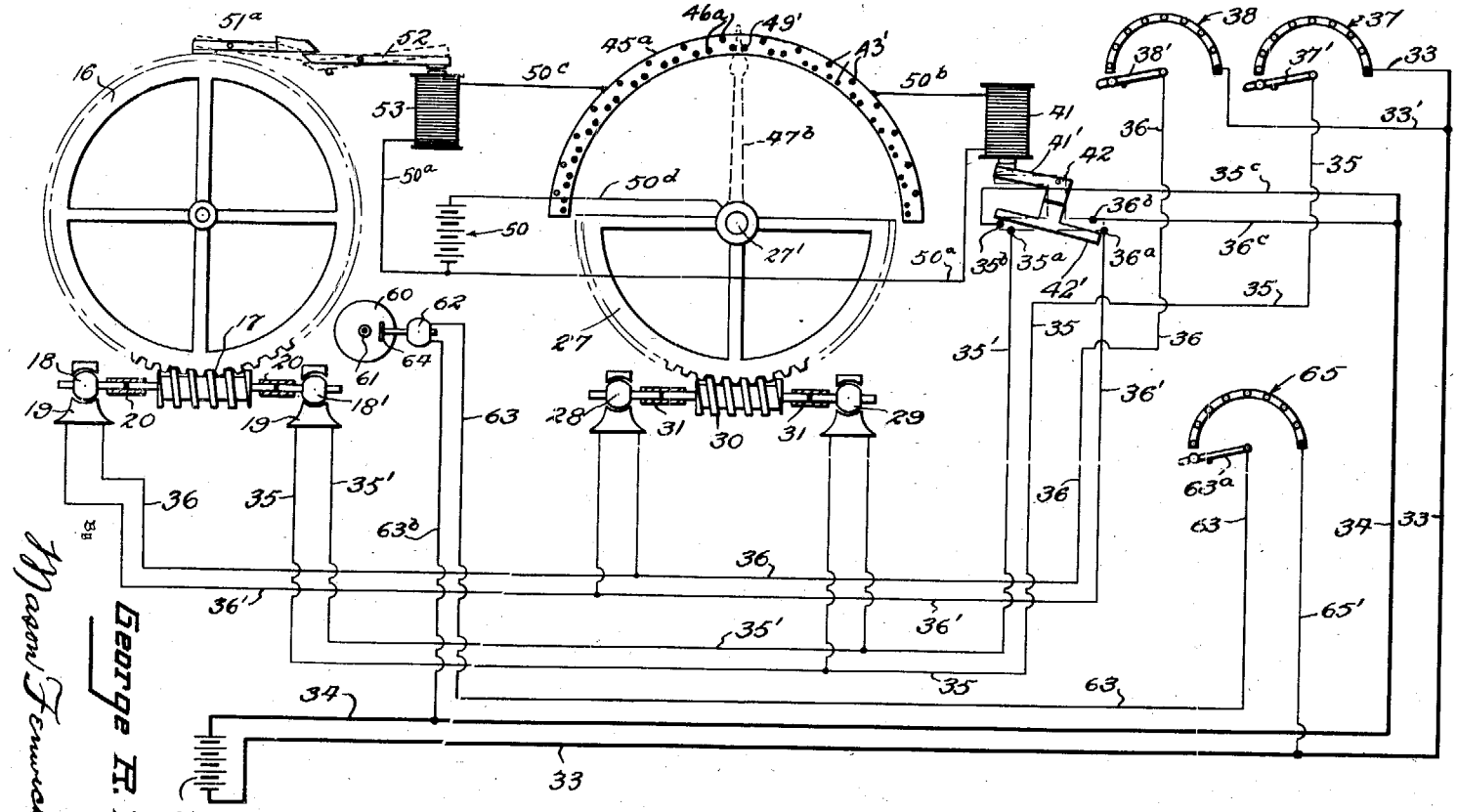
Figure 1 is a diagrammatical view of the invention.

Referring to the drawings in detail, wherein corresponding characters of reference denote corresponding parts throughout the several views, the numeral 5 designates a conventional radio receiving outfit, and which includes the cabinet 6, loud speaker or horn 7′, and vertically aligned rotatable condensers or tuning elements 7, 8 and 9, all of which are mounted upon shelves 10. Each of the condensers or tuning elements includes a shaft 11, and fixed to the shaft 11 of the condenser or tuning coil 7 is a plurality of pulleys 12. A single pulley 13 is fixed to each of the other shafts 11 of the condensers or tuning elements 8 or 9. A pulley 14 is revoluble about the upper end of the horn or loud speaker 7′ and is in vertical alignment with one of the pulleys 12. A drive belt 15 is engaged with the last mentioned pulley 12 and belt 14. Similar drive belts are engaged about the remaining pulleys 12 and 13, respectively.

Also fixed to the shaft 11 of the condenser or tuning element 7 is a worm wheel 16 that is engaged by a horizontal worm shaft 17. Right and left drive motors 18 and 18′ are supported by means of brackets 19 at the opposite ends of the worm 17. These brackets 19 are formed with forwardly projecting threaded shanks 19′, each of which extends through a vertically disposed slot 19*a* formed in the front wall of the cabinet. Wing nuts 19*b* are threaded on these shanks and serve to hold the brackets in a position where the worm 17 normally engages the worm wheel 16, or in a lowered position where this worm 17 will not engage the worm wheel when it is desired to manually adjust the tuning elements as will be hereinafter described. The shafts of these motors are fixed to the ends of the worm shaft 17 by means of fiber or other non-conducting coupling elements 20.

A log or dial 21 of the various radio call stations is provided on the front wall of the cabinet 6 and encircles the flared end of the loud speaker or horn 7′. A circular slot 22 is also provided in this front wall of the cabinet 6 and is disposed at the inner edge of the log or dial 21. An arm 23 is fixed to revolve with the pulley 14 and projects outwardly through the slot 22 and carries a pointer or finger 24 which is movable over the dial 21.

A portable control mechanism is provided which comprises a relatively flat rectangular casing 25 adapted to be supported upon the lap of the operator at a point remote from the cabinet 6. A worm wheel 27 is journaled within this casing and is driven by right and left drive motors 28 and 29, respectively, also contained in the casing 25. A worm shaft 30, identical to the worm shaft 17, engages this worm wheel 27 and is connected with the motors by fiber or other non-conducting couplings 31.

The numeral 32 designates a source of electric energy which may be mounted in the cabinet 6 or any other desirable place. Leading from the source of electric energy 32 is a pair of main feed and return conductors 33 and 34, respectively.

A rheostat 37, connected to the main 33, has the pivoted end of its switch rod 37′ connected by wire 35 to corresponding terminals of the motors 18′ and 29. The wire 35′ is connected to the other terminals of motors 18′ and 29, and terminates in a contact plate 35*a* which is slightly spaced apart and insulated from a similar contact plate 35*b*. A wire 35*c* connects plate 35*b* to the return wire 34.

The rheostat 38, connected independently to main 33 by tap 33′, has the pivoted end of its switch rod 38′ connected by wire 36 to the corresponding terminals of motors 18 and 28. A wire 36′ is connected to the other terminals of motors 18 and 28 and terminates in a contact plate 36*a* which is slightly spaced apart and insulated from a similar contact plate 36*b*. A wire 36*c* connects plate 36*b* to the return wire 34.

An electro-magnet 41, mounted within the casing 25, is adapted, when energized, to swing the pivoted armature 42 from its normal circuit closing position, shown in dotted lines in Figure 1 to the circuit breaking position shown in full lines. The cross conductor plate 42′ of said armature is of sufficient width to make contact with the contacts 35*a*, 35*b*, 36*a* and 36*b* when in its normal position, to which it may be biased by any means common in this art. It will be seen that this circuit connects the two right drive motors and the two left drive motors in independent series circuits which are controlled by the switch arms of the rheostats 37 and 38.

Secured to the upper face of the casing 25 is a pair of concentrically arranged semi-circular yieldable elements 43, having the inner edges of their under faces cut away as at 44 and adapted to frictionally engage the outer ends of sets of slips 45 which are arranged in the edge to edge relation as shown. These slips 45 contain the symbols or call letters of radio broadcasting stations. Arranged concentric to the semi-circular elements 43 and disposed at the inner ends of the slips 45 are semi-circualar clamps 46, the latter being resiliently hinged to the casing 25 as at 46′, and thereby normally urged into clamping engagement with the inner ends of these slips. An elastic tube 47 is carried by each of the clamps to prevent mutilation or marring of the slips by these clamps. An operating handle 48 is carried by each tube 47 at a point centrally of its ends, whereby to swing the clamps away from the casing when it is desired to remove or apply the slips. These slips 45 are arranged in groups, and each group being arranged coincident to a key-letter 48*a* carried by the casing 25. It will therefore be manifest that if the operator desires to tune in on a particular station, for example, Station W-L-A-F, it is only necessary to look to group B and find station 5 of such group, the groups being consecutively numbered on the tubes 47 as indicated at 49*a*. It will be observed that this arrangement provides a log chart which will permit a maximum number of broadcasting stations to be logged. The same is true of the log chart or dial 21 carried by the cabinet 6, and which is identical in construction.

A series of plug receiving openings 46*a* is provided in an arcuate conductor strip 45*a* secured to the under face of the top wall of the casing 25, and located at the outer edge of the outermost semi-circular retaining element 43. Each of these plug receiving openings 46*a* is in alignment with one of the slips 45. Similar openings 43′ are provided in the top wall of the casing and register with the opening 46*a*.

Fixed to the axis 27′ of the worm gear 27 through an insulating sleeve 48*b* is a hand 47*b* adapted to traverse the registered openings 43′ and 46*a* upon the rotation of the said worm gear 27. A broadcasting station selecting hand 48′ is pivoted to said sleeve 48*b* and is manually movable over the slips 45 and adapted to register with any one of the openings 43′ corresponding to a selected station. A plug 49′ is adapted to be arranged in the registering openings 43′ and 46*a* of the selected station and in either of the apertures 49″ formed in the hand 48′.

One terminal of a battery 50 is connected by a wire 50*a* to terminals of the electro-magnets 41 and 53. Wires 50*b* and 50*c* connect the other terminals of magnets 41 and 53 to the arcuate conducting strip 45*a*. The return from the strip 45*a* is effected by contact of a plug 49′, inserted in any one of the openings 46*a*, with the conductor hand 47*b* having its pivoted end electrically connected by wire 50*d* to the other terminal of the battery 50.

Arranged above the worm gear 16 is a pivotally mounted brake element 51*a*, which has one end arranged in the path of movement of the pivoted armature 52 of the electro-magnet 53. As shown in Figure 1, this armature 52 is pivoted intermediate its ends, and the electro-magnet 53 is arranged below the outer end of this armature so that upon energization of the magnet the forward end of the armature will be swung upwardly to engage one end of the brake element 51 to move and hold the latter into braking engagement with the worm gear 16.

In addition to attaining proper tuning of the tuning elements, I also provide means for controlling the sound volume. This means comprises a disk 60 carried by the shaft 61 of the volume control element. An electric motor 62 has one terminal connected by wire 63 to the pivoted end of the switch arm 63*a* of the starting rheostat 65 connected by wire 65′ to the main 33. The other terminal of motor 62 is connected by wire 63*b* to the return main 34. A friction drive element 64 is carried by the motor shaft and frictionally contacts with the disk 60 to rotate the latter to any desired position. The motor 62 is controlled by the rheostat switch 65 carried by the casing 25.

Figure 2:
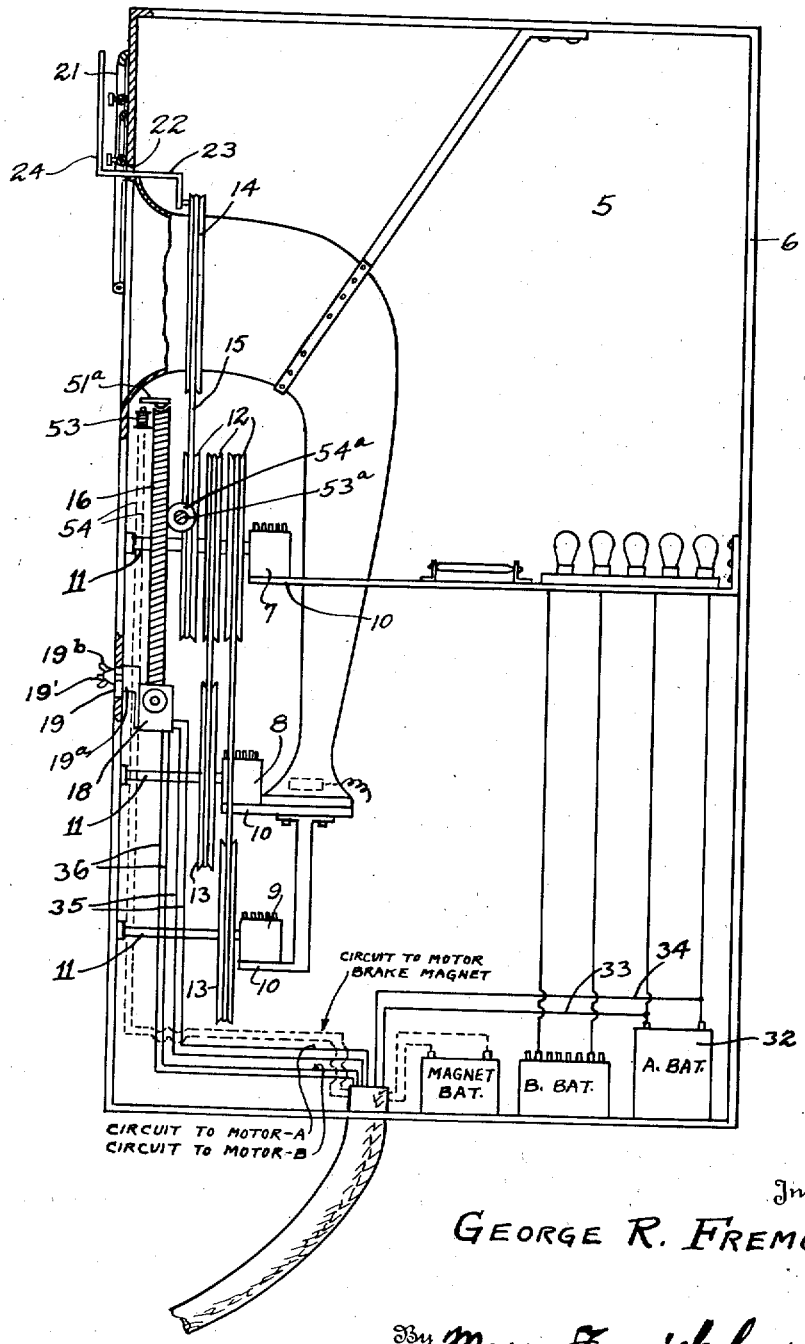
Figure 2 is a view of a radio having one of the side walls of its cabinet removed, and showing parts of the invention associated with the receiving set.

If it is desired to adjust the tuning elements manually, this may be accomplished by means of a hand operated shaft 53*a* journaled in the cabinet 5 and projecting laterally from one side thereof as shown in Figure 4. A friction drive element 54*a* is carried by this shaft 53*a* and engages one face of the worm wheel 16 as illustrated in Figure 2. However, before adjusting this shaft 53*a* the worm 17 is first disengaged from the worm gear 16 by lowering the adjustable brackets 19.

In Figure 6, a modification of the invention is illustrated. This embodiment of the invention contemplates an attachment for a single tuning or condensing element, and comprises a casing 55 which is supported on vertically adjustable legs 56. The rear wall of this casing 55 is provided with a central opening 57 through which the shaft 58 of the tuning or condensing element passes. In this instance, the worm gear 16 is fixed directly to the shaft 58. The motor driving connections and remote control are identical to the structure above described.

As illustrated in Figure 4, all of the conductors which extend from the cabinet 6 to the portable control mechanism are encased in a cable or sheathing 67.

In the operation of the invention, the operator moves the hand 48′ to register with a selected station slip and moves the plug 49′ through the registering openings 49″, 43′ and 46*a*. Either the right or left drive motors are set in operation by manipulating the corresponding switch arm to drive the worm gears 16 and 27 in synchronism, until the hand 47*b* contacts the plug 49′ to complete an electric circuit through the magnet 41, the latter attracting its armature 42 swings it to the full line position indicated in Figure 1 breaking the circuit to the motors. At the same time the electro-magnet 53 is energized and actuates the brake element 51 to stop the worm gear 16 as above stated. During the rotation of the worm gear 16 the tuning elements or condensers will be adjusted or oscillated through the medium of the driving connections above stated. It will be thus observed that the tuning elements or condensers will be simultaneously set, where they will tune in on the selected broadcasting station.

While I have illustrated and described one embodiment of the invention, I wish to emphasize that I do not limit myself to the exact construction set forth, but that I may make alterations and modifications therein, and such alterations and modifications are only governed by the appended claims.

What I claim is:

1. The combination with a radio receiving set, of means operatively connecting all of the tuning elements thereof, drive means for simultaneously rotating the tuning elements including a motor driven element, a portable casing, a log chart carried thereby, a motor driven rotatable element in the casing, electrical means connecting the motors for operating the same in synchronism, means carried by the portable casing for selecting any one of a plurality of radio stations whose call letters are located in the log chart, and means operated by the rotatable element in the portable casing to render the motors inoperative when the tuning elements have reached a point where they will tune in on the selected broadcasting station.

2. The combination with a radio receiving set, of means for simultaneously adjusting the tuning elements thereof, which includes a motor actuated movable member operatively connected with the tuning elements, a portable unit including a motor actuated movable member movable in synchronism with the first mentioned movable member, selective means associated with the unit for selecting a predetermined radio broadcasting station, and means actuated by the station broadcasting selecting means to render the motors inoperative when the tuning elements tune in on the selected station.

3. The combination with a radio receiving set including a plurality of rotatable tuning elements, operative connections between all of such tuning elements, a common electrical drive means for simultaneously adjusting the tuning elements about their axes, a portable chart containing indicia arranged at predetermined positions on the chart and representing radio broadcasting stations, a motor driven element carried by the chart, hands movable over the chart and normally insulated from each other, and one of which being fixed to rotate with such motor driven element, and the other being adapted to be manually set to register with a desired station call symbol, a pivoted brake element supported adjacent the electrical drive means, an electric circuit, an electro-magnet therein and arranged adjacent the brake element adapted to be energized to engage the brake element with the electrical drive means to render the latter inoperative when the two hands are substantially aligned.

4. The combination with a radio receiving set including a plurality of rotatable tuning elements, means operatively connecting the tuning elements together, a driven element fixed to one of the tuning elements, right and left electric motors geared to the driven element, a portable casing and a driven element journaled therein, right and left motors in the casing and geared to such driven element, independent electric circuits connecting the right and left drive motors, a chart on the casing containing various radio broadcasting station symbols, switches for controlling each of the circuits, means for selecting any one of the broadcasting station symbols and operable to render the motors inoperative after the driven elements have moved a predetermined distance.

5. Means for controlling the tuning elements of a radio receiving set comprising a driven element, means operatively connecting the tuning elements to the driven element, sets of right and left drive motors, electric circuits connecting the right and left drive motors of one set to the right and left drive motors of the other set respectively, a conductor strip having a series of pin receiving openings, each of which corresponds in location on said strip to the wave length of a predetermined radio broadcasting station, a brake adjacent the driven element, normally inoperative electrical means for applying the brake to the driven element, a contact pin engageable in any one of the openings, a hand operatively connected to the second set of motors and movable into engagement with the pin by such second set of motors, to operate the electrical brake actuating means and stop the driven element when the tuning elements occupy a position where they tune in on a station corresponding to the location on said strip of the opening in which said pin may be positioned.

6. A remote control attachment for radio tuning elements comprising a motor operated drive element to be fixed upon the shaft of such elements, a portable control unit including a motor driven rotatable element, electric circuits connecting such motors to operate in unison, switches controlling the circuits, an electrically operated brake element adapted to engage the first mentioned drive element when the last mentioned drive element has rotated a predetermined distance.

7. The combination with a radio receiving set including a plurality of rotatable tuning elements, means operatively connecting the tuning elements together, a driven element fixed to one of the tuning elements, right and left electric motors geared to the driven element, a portable casing, a driven element journaled therein, right and left motors in the casing and geared to such driven element, independent electric circuits connecting the right and left drive motors, a chart on the casing containing various radio broadcasting station symbols, switches for controlling each of the circuits, means for selecting any one of the broadcasting station symbols and operable to render the motors inoperative after the driven elements have moved a predetermined distance, a graduated dial on the radio cabinet, an arm movable over the dial and fixed to rotate with part of the tuning element rotating means, and serving as a closeup tuning element adjusting member.

In testimony whereof I affix my name to this specification.

GEORGE R. FREMONT.